(12) United States Patent
Hwang

(10) Patent No.: US 10,251,319 B2
(45) Date of Patent: Apr. 2, 2019

(54) HEAT RADIATION APPARATUS USING MODULAR COOLING APPARATUS

(71) Applicant: LSIS CO., LTD., Gyeonggi-do (KR)

(72) Inventor: Soo-Yong Hwang, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 15/695,040

(22) Filed: Sep. 5, 2017

(65) Prior Publication Data

US 2018/0242474 A1    Aug. 23, 2018

(30) Foreign Application Priority Data

Feb. 23, 2017  (KR) .................. 20-2017-0000907 U

(51) Int. Cl.
*H01L 23/467* (2006.01)
*H02M 7/00* (2006.01)
(Continued)

(52) U.S. Cl.
CPC ......... *H05K 7/209* (2013.01); *H01L 23/3672* (2013.01); *H01L 23/40* (2013.01);
(Continued)

(58) Field of Classification Search
CPC . G06F 1/181–1/182; H05K 7/20218–7/20381; H05K 7/20409–7/20418; H05K 7/20009–7/202; H05K 7/209; H05K 7/1432; H01L 23/367–23/3677; H01L 23/473; H01L 23/46–23/467; H01L 23/3672; H01L 23/40; H01L 2023/4062; H01L 2023/4068; H02M 7/003
(Continued)

(56) References Cited

U.S. PATENT DOCUMENTS 4,953,058 A  *  8/1990  Harris .................. H05K 7/1461
                                              165/80.3
6,377,453 B1 *  4/2002  Belady ............... H05K 7/20345
                                              165/185
(Continued)

FOREIGN PATENT DOCUMENTS

JP    H11294889 A    10/1999
JP    2001-25254 A    1/2001
(Continued)

OTHER PUBLICATIONS

Japanese Office Action for related Japanese Application No. 2017-172393; dated May 29, 2018; (3 pages).
(Continued)

*Primary Examiner* — Jinhee J Lee
*Assistant Examiner* — Razmeen Gafur
(74) *Attorney, Agent, or Firm* — K&L Gates LLP

(57) ABSTRACT

Disclosed herein is a heat radiation apparatus using modular cooling apparatuses. The heat radiation apparatus includes one or more modular apparatuses, and a housing in which the modular apparatuses are inserted. The housing includes an outer frame, and one or more bridges that support the modular cooling apparatuses in the outer frame. A step is formed at the outer frame and the bridges to mount a radiation plate thereon.

8 Claims, 7 Drawing Sheets

(51) Int. Cl.
- *H05K 7/14* (2006.01)
- *H05K 7/20* (2006.01)
- *H01L 23/40* (2006.01)
- *H01L 23/367* (2006.01)

(52) U.S. Cl.
CPC ....... *H01L 23/467* (2013.01); *H05K 7/20163* (2013.01); *H05K 7/20909* (2013.01); *H01L 2023/4062* (2013.01); *H01L 2023/4068* (2013.01); *H02M 7/003* (2013.01); *H05K 7/1432* (2013.01)

(58) Field of Classification Search
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 6,407,923 | B1* | 6/2002 | Gerlock | H05K 7/1457 174/262 |
| 6,829,145 | B1* | 12/2004 | Corrado | H01L 23/4006 165/185 |
| 7,177,152 | B1* | 2/2007 | Sun | F25B 21/02 165/104.33 |
| RE39,784 | E* | 8/2007 | Hsueh | G06F 1/184 165/104.33 |
| 7,330,353 | B2* | 2/2008 | Gilliland | H01L 23/367 165/80.3 |
| 7,808,790 | B2* | 10/2010 | Lin | H01L 23/4093 165/80.3 |
| 8,644,021 | B2* | 2/2014 | Chen | F28D 15/0275 165/80.4 |
| 9,142,483 | B2* | 9/2015 | Sunaga | H01L 23/467 |
| 9,781,820 | B2* | 10/2017 | Matsumoto | H05K 1/0203 |
| 2001/0014029 | A1 | 8/2001 | Suzuki et al. | |
| 2004/0031586 | A1* | 2/2004 | Rearick | H01L 23/4093 165/80.2 |
| 2004/0169956 | A1* | 9/2004 | Oba | G06F 1/20 360/97.15 |
| 2005/0099774 | A1* | 5/2005 | Song | H01L 23/3672 361/700 |
| 2005/0185384 | A1* | 8/2005 | Tanaka | H01L 23/40 361/720 |
| 2006/0090888 | A1* | 5/2006 | Huang | F28D 1/024 165/174 |
| 2006/0185827 | A1* | 8/2006 | Huang | F28D 15/0266 165/104.25 |
| 2006/0289147 | A1* | 12/2006 | Zuo | F28D 15/0266 165/104.26 |
| 2007/0297136 | A1* | 12/2007 | Konshak | H05K 7/20772 361/699 |
| 2009/0065182 | A1* | 3/2009 | Takahashi | F28D 15/0266 165/104.33 |
| 2009/0205197 | A1 | 8/2009 | Kreissig et al. | |
| 2012/0168122 | A1* | 7/2012 | Skepnek | H01L 23/367 165/80.2 |
| 2013/0082520 | A1* | 4/2013 | Leemans | H01G 4/38 307/9.1 |
| 2014/0321056 | A1* | 10/2014 | Yoshikawa | H05K 7/20818 361/697 |
| 2015/0021756 | A1* | 1/2015 | Adachi | H01L 23/473 257/714 |
| 2015/0070844 | A1* | 3/2015 | Chang | H05K 7/20781 361/699 |
| 2015/0138770 | A1* | 5/2015 | Kwak | F21V 5/04 362/244 |
| 2015/0323229 | A1* | 11/2015 | Kim | F28D 1/0535 165/104.21 |
| 2016/0150677 | A1* | 5/2016 | Thao | H05K 7/20136 361/695 |
| 2017/0307304 | A1* | 10/2017 | Hirasawa | F28D 15/02 |
| 2017/0341638 | A1* | 11/2017 | Sawada | B60W 20/10 |

FOREIGN PATENT DOCUMENTS

| | | |
|---|---|---|
| JP | 2001308246 A | 11/2001 |
| JP | 2002368170 A | 12/2002 |
| JP | 2003-33002 A | 1/2003 |
| JP | 2003-259600 A | 9/2003 |
| JP | 2009296708 A | 12/2009 |
| JP | 2012125132 A | 6/2012 |
| JP | 2013229962 A | 11/2013 |
| JP | 2014-220334 A | 11/2014 |
| JP | 2015133875 A | 7/2015 |

OTHER PUBLICATIONS

Partial European Search Report for related European Application No. 17188349; dated Mar. 13, 2018; (10 pages).

\* cited by examiner (a)

(b)

HEAT RADIATION APPARATUS USING MODULAR COOLING APPARATUS

CROSS-REFERENCE TO RELATED APPLICATIONS

This application claims the priority of Korean Patent Application No. 20-2017-0000907 filed on Feb. 23, 2017, in the Korean Intellectual Property Office, the disclosure of which is hereby incorporated by reference in its entirety.

BACKGROUND

1. Technical Field

The present disclosure relates to a heat radiation apparatus using a modular cooling apparatus.

2. Description of the Related Art

Typically, an inverter receives AC mains electricity to converter it into a DC power, and then converts it again into an AC power suitable for electric motors to supply it.

Such an inverter effectively controls an electric motor, thereby reducing the power consumption of the motor to improve energy efficiency.

Such an inverter includes a number of input and output terminals, a power semiconductor for DC-to-AC conversion, and a cooling system for releasing heat generated during conversion to the outside, etc. Among others, in an inverter, a power semiconductor such as an insulated gate bipolar transistor (IGBT) is provided, which is one of the most important components that is essential for high efficiency and high speed power systems. Unfortunately, when the IGBT is driven, which is a high-speed switching device, power loss is generated and is converted into a large amount of heat, resulting in temperature rise inside the inverter. As a result, the performance of the inverter deteriorates and the service life is shortened. In view of the above, a cooling system for absorbing heat generated in the inside of electronic devices and transferring the heat to the outside air is required.

FIG. 1 is a view for illustrating an existing cooling system of an inverter.

As shown in FIG. 1, in the existing cooling system for a power electronic apparatus, a cooling fan 130 and a heat sink 140 are disposed inside a case 110 of the power electronic apparatus, and power semiconductors 100 are disposed above the heat sink 140, to carry out heat dissipation.

The heat generated by the power semiconductors 100 is radiated by an air-cooling heat dissipation structure as shown in FIG. 1. The heat sink 140 is an essential element of the cooling system, which is used to release the heat generated in the power semiconductors 100.

Typically, an extruded heat sink 140 is commonly used, which can be produced at a low cost and has excellent heat dissipation performance. Large cooling systems require a large size heat sink. Due to practical constraints such as manufacturing facility and production price, a swaged heat sink or a bonded heat sink are also used, which are produced by combining fins and upper/lower plates separately prepared. However, a swaged heat sink or a bonded heat sink has somewhat lower heat dissipation performance since thermal resistance between the fins and the upper and lower plates are greater than that of the extruded heat sink in which the upper and lower parts are integrated.

Recently, as large-capacity inverters have been widely used, the number and size of IGBT modules are increased. Accordingly, a heat sink having a higher performance is required. Therefore, there is a growing demand for an extruded heat sink having a low production cost and excellent heat dissipation performance.

However, it is difficult to produce a large extruded heat sink because a large-sized facility capable of providing a high extrusion pressure is required in order to produce such a large extruded heat sink.

SUMMARY

It is an object of the present disclosure to provide a heat radiation apparatus using modular cooling apparatuses, which makes it easier to produce a large extruded heat sink and increases the cooling efficiency by way of implementing a heat sink for cooling down a heat generating element as a module.

It is another object of the present disclosure to provide a heat radiation apparatus using modular cooling apparatuses, which improves the radiation effects by way of controlling air flow with a wind guide disposed between the modular cooling apparatuses.

In accordance with one aspect of the present disclosure, a heat radiation apparatus includes: a plurality of modular cooling apparatuses each having a radiation plate on which the heat generating element is disposed; and a housing detachably coupling the modular cooling apparatuses with one another. The housing includes an outer frame; an opening formed in the outer frame; and one or more bridges installed at the outer frame to partition the opening and supporting the modular cooling apparatuses inserted in the opening.

Each of the modular cooling apparatuses may further include a plurality of radiation fins disposed under the radiation plate in a longitudinal direction thereof, the radiation fins may be inserted into the opening, and the radiation plate may be mounted on the outer frame and the bridges.

The length of an area where the radiation fins are disposed in a width direction thereof may be smaller than the length of the radiation plate in the width direction.

The length of an area where the radiation fins are disposed in a length direction thereof may be smaller than the length of the radiation plate in the length direction.

A step may be formed at the outer frame and the bridges, on which the radiation plate is mounted.

The radiation plate may have a rectangular or square shape.

The radiation plate may be made of a metallic material.

The heat radiation apparatus may further include at least one wind guide inserted between the modular cooling apparatuses to control air flow introduced into the modular cooling apparatuses.

The width of the wind guide may be equal to the width between the modular cooling apparatuses, the length of the wind guide may be equal to the length of the modular cooling apparatuses, and the height of the front face of the wind guide may be equal to the height of the radiation fins and may be reduced toward a rear face thereof A space formed inside the housing may be partitioned by the bridges for installing the modular cooling apparatuses, the bridges are disposed at the outer frame such that they are movable thereon, and a size or shape of spaces partitioned by the bridges is changed as the bridges move.

Rails may be formed at the outer frame, moving parts may be movably installed along the rails, and the bridges may be coupled with the moving parts and installed movably at the outer frame.

According to the exemplary embodiment of the present disclosure, a large-capacity cooling apparatus can be implemented with modular cooling apparatuses, it is easy to handle and install the large-capacity cooling apparatus, and it is possible to prevent improved heat dissipation performance by the control of the air flow by the wind guides installed between the modules.

Further, the heat radiation apparatus according to the exemplary embodiment of the present disclosure employs modular cooling apparatuses that can release heat at the optimal efficiency, and thus cooling efficiency can be increased. In addition, when there are changes in ambient environment such as altitude, temperature and humidity, the locations of the major components can be changed by simply moving the housing, such that it is possible to cool down the heat generation elements at the optimal efficiency and to cope with the change efficiently and quickly.

DETAILED DESCRIPTION

Figure 1:
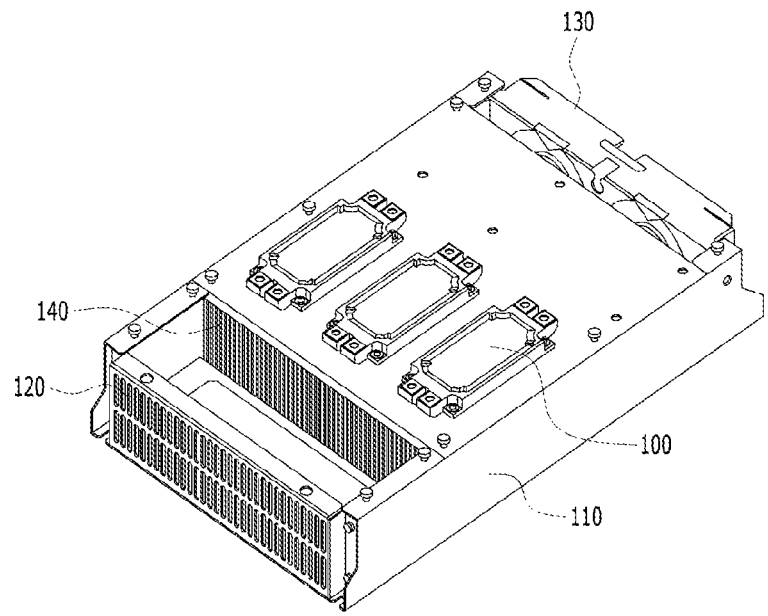
FIG. 1 is a view for illustrating an existing heat radiation apparatus of an inverter.

Exemplary embodiments of the present disclosure will now be described in detail with reference to the accompanying drawings to facilitate understanding of the configuration and effects thereof. The scope of the present disclosure may, however, be embodied in many different forms and should not be construed as limited to the embodiments set forth herein. These embodiments are provided so that this disclosure will be thorough and complete, and will fully convey the scope of the inventive subject matter to those skilled in the art. In the drawings, the size of some of the elements may be exaggerated for convenience of illustration and not drawn on scale for illustrative purposes.

It will be understood that when an element such as a layer, region, substrate, or panel is referred to as being "on" or "connected to" another element, it can be directly on the other element or intervening elements may also be present. In contrast, when an element is referred to as being "directly on" or "directly connected to" another element, there are no intervening elements present. The same may be applied to other expressions for describing relationship between elements such as "between" and "directly between".

Terms such as first, second, etc. in the description and in the claims are used for distinguishing between similar elements and not necessarily for describing a sequential or chronological order. The terms are only used to differentiate one component from other components. For example, the terms so used are interchangeable under appropriate circumstances without departing from the scope of the present disclosure.

As used herein, the singular form of "a", "an", and "the" include plural references unless the context clearly dictates otherwise. It will be further understood that the terms "comprises" or "have" used in this specification, specify the presence of stated features, steps, operations, components, parts, or a combination thereof, but do not preclude the presence or addition of one or more other features, numerals, steps, operations, components, parts, or a combination thereof.

The terms used herein, including technical terms, have the same meanings as terms that are generally understood by those skilled in the art, as long as the terms are not explicitly defined differently.

Hereinafter, exemplary embodiments of the present disclosure will be described in detail with reference to the accompanying drawings.

Figure 2:
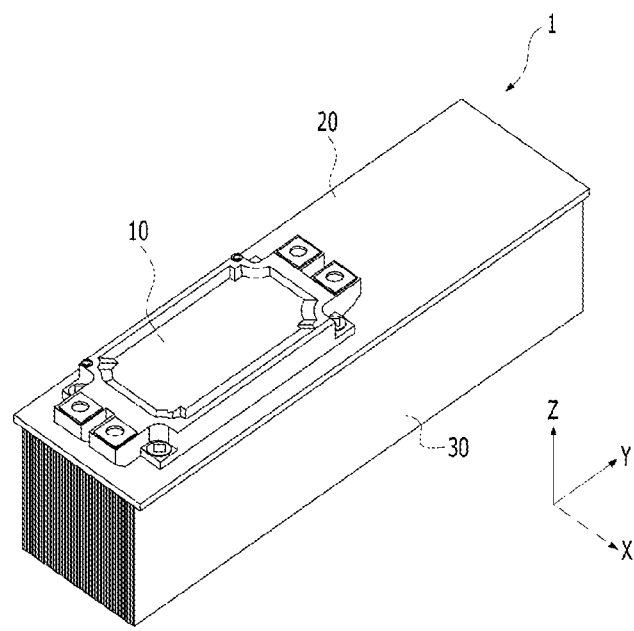
FIGS. 2 and 3 are perspective views of modular cooling apparatuses according to an exemplary embodiment of the present disclosure.
Figure 3:
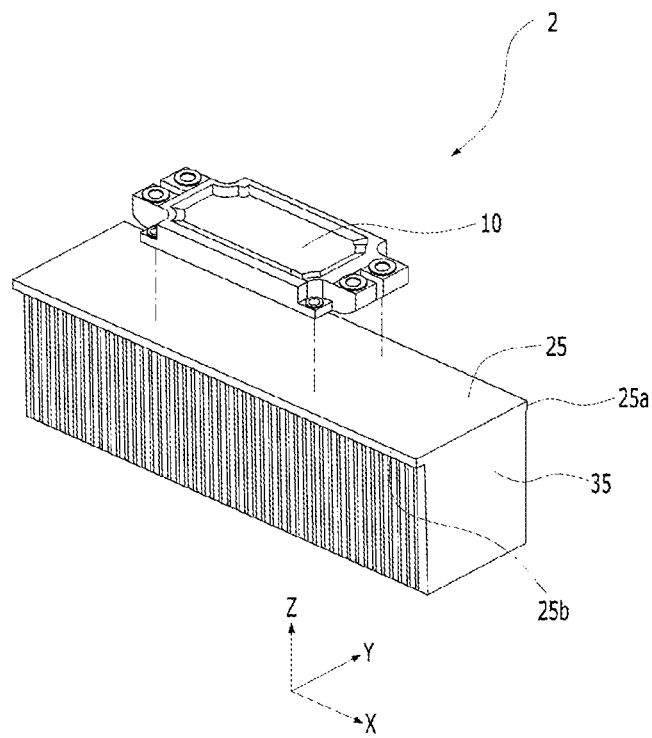

FIGS. 2 and 3 are perspective views of modular cooling apparatuses according to an exemplary embodiment of the present disclosure. FIG. 2 shows a vertical cooling apparatus 1, and FIG. 3 shows a horizontal cooling apparatus 2.

Referring to FIG. 2, the vertical cooling apparatus 1 according to an exemplary embodiment of the present disclosure includes a radiation plate 20 in which a heat generating element 10 is disposed, and a plurality of radiation fins 30 each vertically extended and arranged in the longitudinal direction of the radiation 20 under the radiation plate 20. The sum of widths of the radiation fins 30 in the y-direction may be equal to the length of the radiation plate 20 in the y-direction.

The heat generating element 10 may be, but is not limited to, a semiconductor switching element such as an insulated gate bipolar transistor (IGBT). The heat generating element 10 may be various heat generating elements of the inverter as well. In addition, it is to be noted that the exemplary embodiments of the present disclosure are not limited to the inverter and but may be employed by a cooling apparatus for cooling a heat generating element of a variety of electronic apparatus.

The heat generating element 10 may be disposed on one side of the radiation plate 20. The heat generating element 10 may be disposed closer to the region of the radiation plate 20 where air is introduced. However, this is merely illustrative. The heat generating element 10 may also be disposed in the center. The heat generating element 10 may be fixed to 20 by, for example, a screw. However, this is merely illustrative. The heat generating element 10 may be fixed to the radiation plate 20 with an adhesive or the like.

The radiation plate 20 may be made of a metal material having a high radiation efficiency. The radiation plate 20 may be formed, but is not limited to, in a rectangular shape having a width equal to that of the heat generating element 10. For example, the radiation plate 20 may be formed in various shapes such as a square.

The radiation fins 30 may be equally spaced apart from one another or may become closer to one another from the central portion to the both sides so that the radiation efficiency can be increased.

The radiation plate 20 and the radiation fins 30 may be formed by extruding. It is to be noted that this is merely illustrative. third radiation plate 20 and the radiation fins 30 may be formed by swaging or bonding the radiation plate 20 and the radiation fins 30.

By virtue of the vertical cooling apparatus 1, the heat generated in the heat generating element 10 can be release along the radiation plate 20 and the radiation fins 30.

Referring now to FIG. 3, the horizontal cooling apparatus 2 according to an exemplary embodiment of the present disclosure may include a radiation plate 20 in which a heat generating element 10 is disposed, and a plurality of radiation fins 35 each vertically extended and arranged in the y-direction of the radiation 25 under the radiation plate 25. That is, the radiation fins 35 of the horizontal cooling apparatus 2 may be disposed perpendicular to the radiation fins 30 of FIG. 2. The length of the radiation fins 30 in the y-direction may be equal to the length of the radiation plate 20 in the y-direction.

Figure 4:
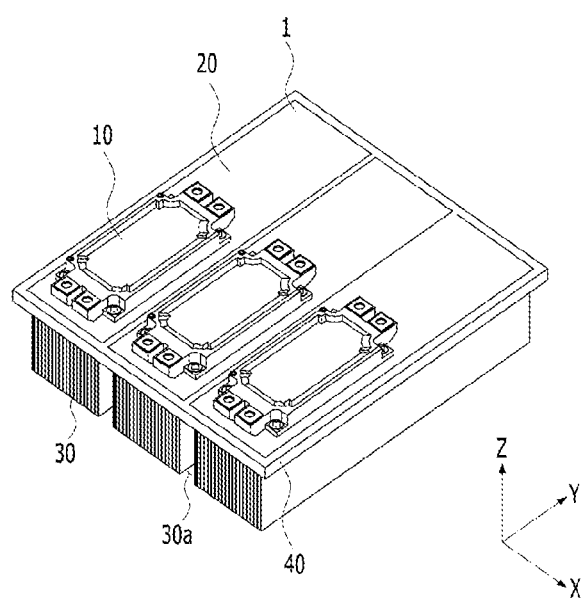
FIGS. 4 and 5 are views for illustrating the modular cooling apparatuses according to the exemplary embodiments of the present disclosure inserted into the housings.
Figure 5:
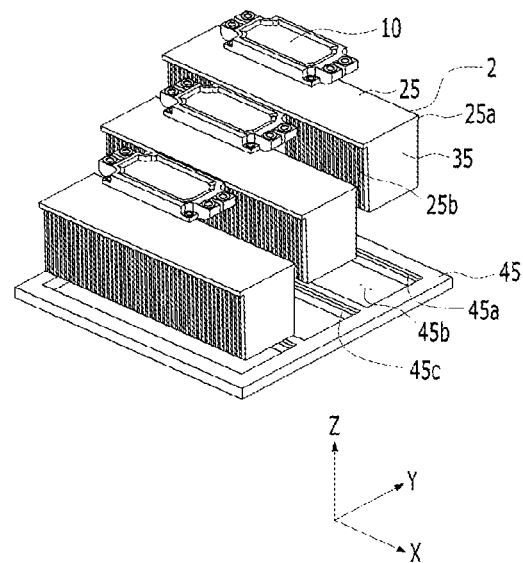

FIGS. 4 and 5 are views for illustrating the modular cooling apparatuses according to the exemplary embodiments of the present disclosure inserted into the housings. FIG. 4 shows an example in which the vertical cooling apparatus 1 of FIG. 2 is combined with other vertical cooling apparatuses. FIG. 5 shows an example in which the horizontal cooling apparatus 2 of FIG. 2 is combined other horizontal cooling apparatuses.

Referring to FIG. 4, it can be seen that the vertical cooling apparatuses are coupled by a housing 40. Referring to FIG. 5, it can be seen that the horizontal cooling apparatuses 2 are coupled by a housing 45.

According to exemplary embodiments of the present disclosure, three vertical cooling apparatuses 1 are coupled with one another by the housing 40, or three horizontal cooling apparatuses 2 are coupled with one another by the housing 45, as shown in FIGS. 4 and 5, respectively. However, this is merely illustrative.

In the vertical cooling apparatus 1, the radiation fins 30 have a width slightly narrower than the width of the radiation plate 20 in the x-direction, and the radiation plate 20 may be mounted on the step of the housing 40. Similarly, in the horizontal cooling apparatus 2, the width of the radiation fins 35 may be slightly narrower than the width of the radiation plate 25 so that the radiation plate 25 may be mounted on the step 45a of the housing 45. This will be described with reference to the drawings.

Figure 6:
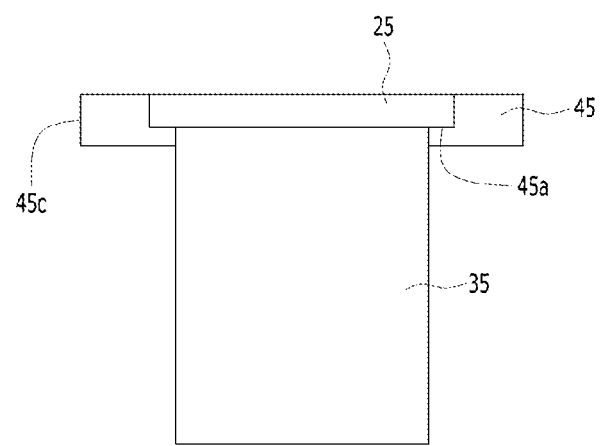
FIG. 6 is a cross-sectional view for illustrating a way of coupling the modular cooling apparatus according to an exemplary embodiment of the present disclosure with a housing.

FIG. 6 is a cross-sectional view for illustrating a way of coupling the modular cooling apparatus according to an exemplary embodiment of the present disclosure with a housing.

Referring to FIGS. 5 and 6, the width of the radiation plate 25 is slightly larger than the width of the radiation fins 35, such that the radiation plate 25 may be mounted on the step 45a of the housing 45.

An opening 45b having a size equal to the size of the radiation plate 25 may be formed in the housing 45. The modular cooling apparatus 2 may be mounted on the housing 45 via the opening 45b. The housing 40 of the vertical cooling apparatus 1 may also have a similar configuration to the housing 45 of the horizontal cooling apparatus 2 described above. As described above, by using various shapes of the housings 40 and 45 in which the modular cooling devices 1 and 2 are disposed, it is possible to implement various large-capacity cooling apparatuses.

Figure 7:
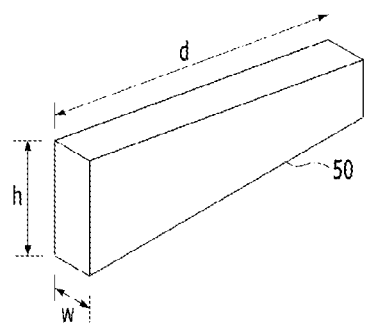
FIG. 7 is views showing examples of the wind guide.
Figure 7:
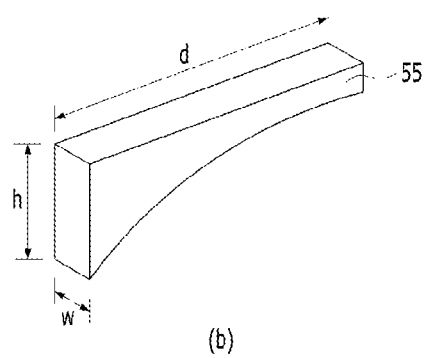

Referring to FIG. 4, a wind guide may be inserted in an area 30a between the vertical cooling apparatuses 1 combined by the housing 40 and arranged spaced apart from one another. FIG. 7 is views showing examples of the wind guide.

As shown in the drawings, the wind guides 50 and 55 may be inserted in the area 30a between the vertical cooling apparatuses 1 to control the air flow of the modular cooling apparatuses 1. The width w thereof may be equal to the width of the area 30a between the vertical cooling apparatuses 1 and the length d thereof may be equal to the length of the vertical cooling apparatuses 1 in the y-direction.

The height h of the front face of the wind guides 50 and 55 may be equal to the height of the radiation fins 30 and may become smaller toward the rear face in a tapered shape. The height may be reduced such that the cross section has a linear shape as shown in FIG. 7 (a) or such that the cross section has a curved shape as shown in FIG. 7 (b). The shape of the cross section of the wind guides 50 and 55 may vary depending on how to control the air flow.

Figure 8:
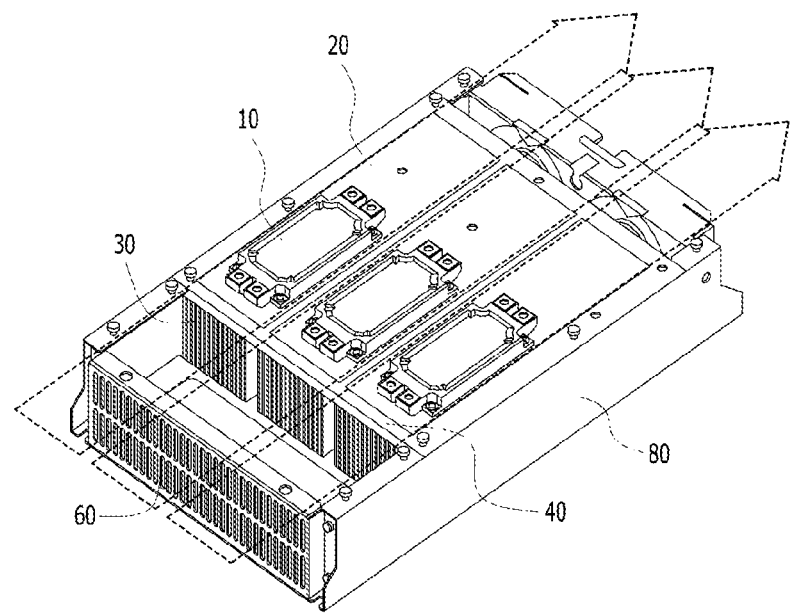
FIGS. 8 and 9 are views for illustrating heat radiation apparatuses according to exemplary embodiments of the present disclosure.
Figure 9:
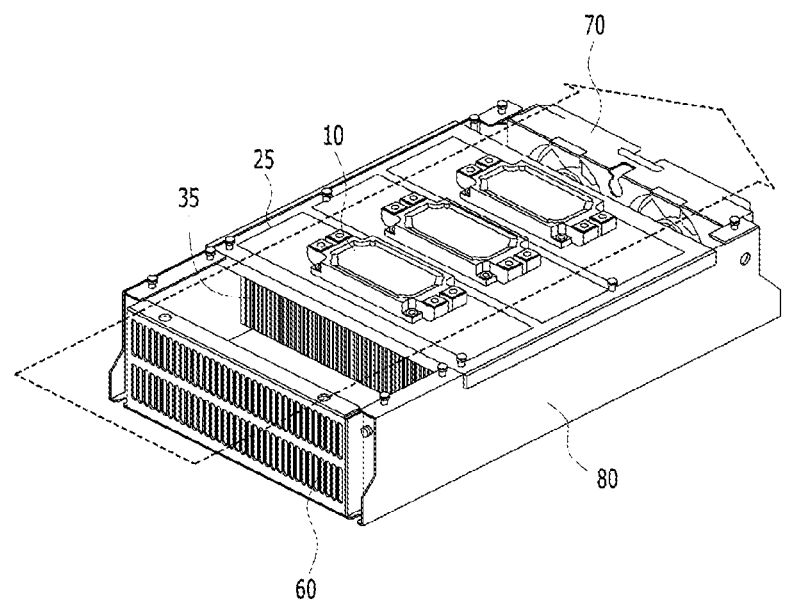

FIGS. 8 and 9 are views for illustrating heat radiation apparatuses according to exemplary embodiments of the present disclosure. FIG. 8 shows an example in which the vertical cooling apparatus of FIG. 2 is employed. FIG. 9 shows an example in which the horizontal cooling apparatus of FIG. 3 is employed.

As shown in FIG. 8, the vertical cooling apparatuses 1 are coupled with one another by the housing 40, and may be mounted inside the case 80. A vent hole 60 may be disposed in front of the plurality of vertical cooling apparatuses 1, while a cooling fan 70 may be provided in rear thereof.

The outside air passes through the plurality of vertical cooling apparatuses 1 by the air flow generated by the operation of the cooling fan 70. Meanwhile, the air exchanges heat with the vertical cooling apparatuses 1, and then the heat can be released to the outside, thereby dissipating the heat of the heat generating element 10.

The flow of the air is such that the outside air introduced through the vent hole 60 may flow out to the cooling fan 70 or the outside air flowing through the cooling fan 70 may flow out through the vent hole 60. Although not shown in the drawings, the wind guides 50 and 55 of FIG. 4 may be disposed between the plurality of vertical cooling apparatuses 1 and may guide the air flow so that the outside air passing through the apparatuses 1 can efficiently flow.

As shown in FIG. 9, a plurality of horizontal cooling apparatuses 2 are coupled with one another by the housing 45, and may be mounted inside the case 80. A vent hole 60 may be disposed in front of the plurality of horizontal cooling apparatuses 2, while a cooling fan 70 may be provided in rear thereof.

The outside air passes through the plurality of horizontal cooling apparatuses 2 by the air flow generated by the operation of the cooling fan 70. Meanwhile, the air exchanges heat with the horizontal cooling apparatuses 2, and then the heat can be released to the outside, thereby dissipating the heat of the heat generating element 10.

The flow of the air is such that the outside air introduced through the vent hole 60 may flow out to the cooling fan 70 or the outside air flowing through the cooling fan 70 may flow out through the vent hole 60.

In other words, the heat radiation apparatus according to the exemplary embodiments shown in FIGS. 8 and 9 can be implemented by using modular cooling apparatuses 1 and 2, such that they can be easily assembled and disassembled and maintained more easily and efficiently. Besides, the heat dissipation performance can be further improved by the action of the wind guides.

In addition, according to the exemplary embodiment of the present disclosure, a large-capacity heat radiation apparatus can be implemented with modular cooling apparatuses, it is easy to handle and install the large-capacity heat radiation apparatus, and it is possible to prevent improved heat dissipation performance by the control of the air flow by the wind guides installed between the modules.

Further, the heat radiation apparatus according to the exemplary embodiment of the present disclosure employs modular cooling apparatuses that can release heat at the optimal efficiency, and thus cooling efficiency can be increased. In addition, when there are changes in ambient environment such as altitude, temperature and humidity, the locations of the major components can be changed by simply moving the housing, such that it is possible to cool down the heat generation elements at the optimal efficiency and to cope with the change efficiently and quickly.

According to the exemplary embodiment of the present disclosure, modular cooling apparatuses may be disposed in a variety of ways. FIGS. 10A to 10C are views for illustrating other examples of housings employing the modular cooling apparatuses according to exemplary embodiments of the present disclosure, which are bottom views of the cooling apparatuses 1 inserted in the housings 42.

Figure 10:
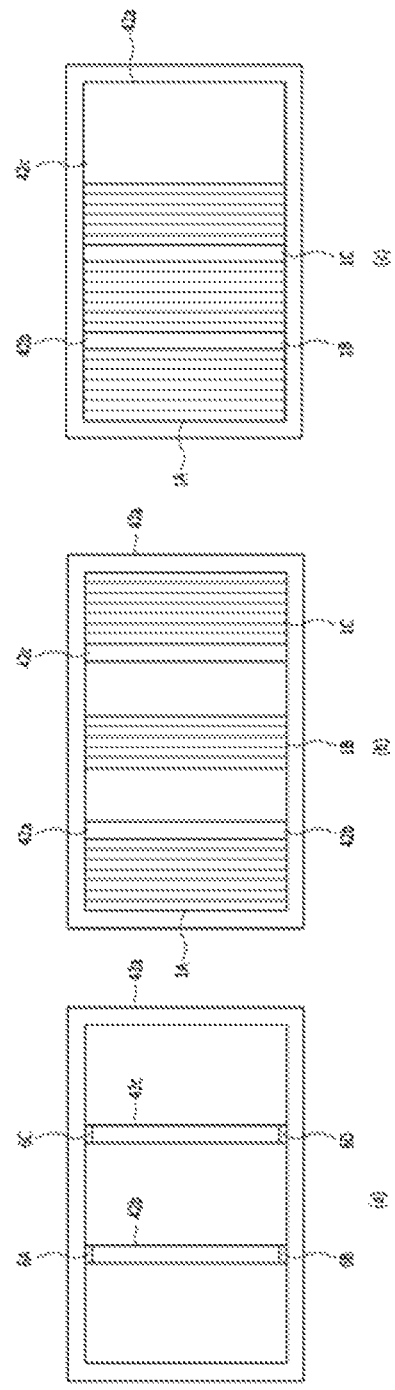
FIG. 10 is views for illustrating other examples of housings employing the modular cooling apparatuses according to exemplary embodiments of the present disclosure.

As shown in FIG. 10 (*a*), the housing 42 may include an outer frame 42*a*, a first bridge 42*b*, and a second bridge 42*c*. Although three cooling apparatuses are disposed in the example shown in FIG. 10A, this is merely illustrative. More or less than two bridges may be disposed in order to dispose more or less than three cooling apparatuses. In the following description, the vertical cooling apparatuses 1 will be described as an example for convenience of illustration. It is, however, to be understood that the horizontal cooling apparatuses 2 may also be equally applied.

The first bridge 42*b* may be disposed movably on the outer frame 42*a* by an upper moving part 6A and a lower moving part 6B which are respectively provided on opposite sides of the outer frame 42*a*. Although not specifically shown in the drawings, rails may be disposed on the outer frame 42*a*, and the upper moving part 6A and the lower moving part 6B may be movably mounted on the rails. In addition, the outer frame 42*a* may be coupled with the upper and lower moving parts 6A and 6B in various ways. Likewise, the second bridge 42*c* may be movably installed on the outer frame 42*a* by an upper moving part 6C and a lower moving part 6D.

As shown in FIG. 10 (*b*), the first bridge 42*b* may move to a side to be connected to a cooling apparatus 1A on the side, while the second bridge 42*c* may move to the other side to be connected to a cooling apparatus 1B on the other side. By doing so, the three cooling apparatuses 1A, 1B and 1C can be spaced apart from one another by a sufficient spacing.

Alternatively, as shown in FIG. 10 (*c*), by moving the first and second bridges 42*b* and 42*c* to one side and the three cooling devices 1A, 1B and 1C in the same direction, it is possible to make the gap between the cooling apparatuses 1A, 1B and 1C as narrow as possible (i.e., equal to the width of the bridge), and the other side may become empty.

That is, the size of the inside of the housing 42 can be adjusted by moving the bridges 42*b* and 42*c* inside the housing 42. Such adjustment may be determined based on the cooling efficiency. For example, when one of the plurality of cooling fans fails such that it is necessary to dispose cooling apparatuses in the area other than the cooling fan is disposed, the above-described housing 42 would be useful.

Figure 11:
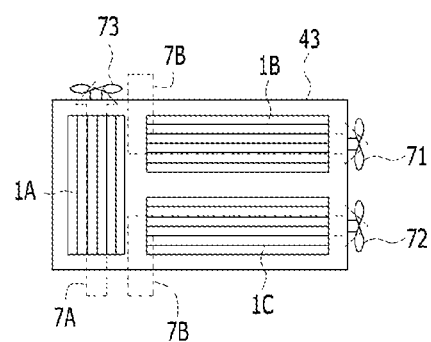
FIG. 11 is a view for illustrating other examples of housings employing the modular cooling apparatuses according to exemplary embodiments of the present disclosure.

FIG. 11 is a view for illustrating yet another example of a housing employing the modular cooling apparatuses according to an exemplary embodiment of the present disclosure, which are bottom views of the cooling apparatuses 1 inserted in the housings 43.

Figure 12:
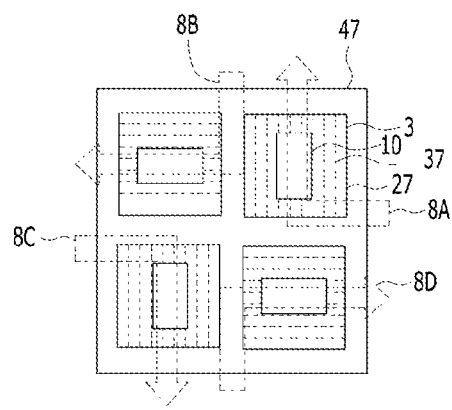
FIG. 12 is a view for illustrating other examples of housings employing the modular cooling apparatuses according to exemplary embodiments of the present disclosure.

As shown in the drawings, in the housing 43 according to an exemplary embodiment of the present disclosure, one cooling apparatus 1A may be disposed vertically while the other two cooling apparatuses 1B and 1C may be disposed horizontally. In such configuration, when the cooling fans 71, 72 and 73 are disposed in front of the respective cooling apparatuses, the air flow may be controlled according to the configuration of the cooling apparatuses. In FIG. 12, the air flows are denoted by the arrows 7A, 7B and 7C, respectively.

According to the above configuration, it is possible to configure cooling apparatuses depending on air flow by simply changing shapes of the housing, and thus a variety of shapes of cooling apparatuses can be simply implemented.

FIG. 12 is a view for illustrating yet another example of a housing employing the modular cooling apparatuses according to an exemplary embodiment of the present disclosure, in which the heat generating element 10 is disposed at the center of the rectangular radiation plate 27. FIG. 12 is a top view showing that cooling apparatuses 3 are inserted into the housing 47. Radiation fins 37 are shown in dotted lines because they are actually visible when viewed from the top.

As shown in FIG. 12, the heat generating elements 10 may be disposed on the square radiation plate 27 according to the air flows 8A, 8B, 8C and 8D.

That is, it is possible to configure cooling apparatuses depending on air flow by simply changing shapes of the housing, and thus a variety of shapes of cooling apparatuses can be simply implemented.

Although the exemplary embodiments of the present disclosure have been described in detail, these are merely illustrative. It will be appreciated by those skilled in the art that various modifications and equivalents are possible without departing from the scope of the present disclosure. Accordingly, the true scope of the present disclosure sought to be protected is defined only by the appended claims.

What is claimed is:

1. A heat radiation apparatus comprising:
   a plurality of modular cooling apparatuses each having a radiation plate on which the heat generating element is disposed; and
   a housing detachably coupling the modular cooling apparatuses with one another,
   wherein the housing comprises
      an outer frame;
      an opening formed in the outer frame; and
      one or more bridges installed at the outer frame to partition the opening and supporting the modular cooling apparatuses inserted in the opening,
   wherein each of the modular cooling apparatuses further comprises a plurality of radiation fins disposed under the radiation plate in a longitudinal direction thereof,
   wherein the bridges are disposed at the outer frame such that they are movable thereon,
   wherein a size or shape of the opening partitioned by the bridges is changed as the bridges move,
   wherein rails are formed at the outer frame, wherein moving parts are movably installed along the rails, wherein the bridges are coupled with the moving parts,
wherein the radiation plate is mounted on the outer frame and the bridges, and
wherein the radiation fins are inserted into the opening partitioned by the bridges.

2. The heat radiation apparatus of claim 1, wherein a length of an area where the radiation fins are disposed in a width direction thereof is smaller than a length of the radiation plate in the width direction.

3. The heat radiation apparatus of claim 1, wherein a length of the area where the radiation fins are disposed in a length direction thereof is smaller than a length of the radiation plate in the length direction.

4. The heat radiation apparatus of claim 1, wherein a step is formed on the outer frame and the bridges, wherein the radiation plate is mounted on the step.

5. The heat radiation apparatus of claim 1, wherein the radiation plate has a rectangular or square shape.

6. The heat radiation apparatus of claim 1, wherein the radiation plate is made of a metallic material.

7. The heat radiation apparatus of claim 1, further comprising: at least one wind guide inserted between the modular cooling apparatuses to control air flow introduced into the modular cooling apparatuses.

8. The heat radiation apparatus of claim 7, wherein a width of the wind guide is equal to a width between the modular cooling apparatuses,
wherein a length of the wind guide is equal to a length of the modular cooling apparatuses, and
wherein a height of the front face of the wind guide is equal to a height of the radiation fins and is reduced toward a rear face thereof.

* * * * *